United States Patent [19]
Cox, Jr. et al.

[11] 3,936,762
[45] Feb. 3, 1976

[54] DIGITAL PHASE-LOCK LOOP SYSTEMS FOR PHASE PROCESSING OF SIGNALS

[75] Inventors: Duncan B. Cox, Jr., Manchester; William H. Lee, Arlington, both of Mass.

[73] Assignee: The Charles Stark Draper Laboratory, Inc., Cambridge, Mass.

[22] Filed: June 17, 1974

[21] Appl. No.: 480,032

[52] U.S. Cl. ............... 329/104; 325/320; 325/346; 329/122; 331/23
[51] Int. Cl.² ..................... H04L 27/14; H03C 3/24
[58] Field of Search ............. 329/50, 104, 122–126; 331/23, 25, 18; 325/320, 346, 419

[56] References Cited
UNITED STATES PATENTS

| | | | |
|---|---|---|---|
| 3,099,796 | 7/1963 | Zadoff | 325/320 X |
| 3,370,252 | 2/1968 | Zoerner | 331/25 X |
| 3,449,691 | 6/1969 | Pasternack et al. | 329/104 X |
| 3,688,196 | 8/1972 | Doelz | 329/124 X |
| 3,849,736 | 11/1974 | Enerson et al. | 331/25 X |
| 3,859,631 | 1/1975 | Holmes et al. | 329/126 X |

*Primary Examiner*—Alfred L. Brody
*Attorney, Agent, or Firm*—Robert F. O'Connell

[57] ABSTRACT

A digital phase-locked loop in which an error signal representing the difference between the phases of an input signal and an output signal is converted to a digital signal having a time-varying value. A programmable divider means is provided to produce a pulse control signal having a frequency which varies in accordance with the time-varying value of the digital signal. The pulse control signal controls the number of pulses which are deleted from a reference clock signal to produce an intermediate signal which in turn is fed to a feedback counter for producing the output signal, the phase of which depends on the number of deleted pulses, so that the phase of the output signal effectively follows the phase of the input signal.

25 Claims, 9 Drawing Figures

DIGITAL PHASE-LOCK LOOP SYSTEMS FOR PHASE PROCESSING OF SIGNALS

INTRODUCTION

This invention relates generally to systems for processing the phase of signals and, more particularly, to phase locked loop systems using digital techniques for phase tracking or phase filtering of signals.

BACKGROUND OF THE INVENTION

Information is frequently transmitted by systems which modulate the phase or frequency of a carrier signal. This type of modulation is used both for signals transmitted over wires and for radio signals transmitted via electromagnetic radiation. A receiver of such signals frequently must perform a filtering operation on the transmitted signals to eliminate noise and signals not within the frequency band of the transmitted signal. When digital data is transmitted by means of well-known phase-shift keying (PSK) or frequency-shift keying (FSK) techniques, in addition to a filtering operation, the receiver system must also provide a conversion of the phase information to digital form.

Other applications in which the information is encoded on the phase of a signal include navigation systems, such as LORAN and OMEGA systems, and systems using angle readout transducers, such as resolvers and synchros (or selsyns) where the mechanical angle of a rotating shaft is converted to an electrical phase-angle by the operation of the transducer. In such systems it is important that the phase angle of the signal be recovered very accurately. Also, in such applications there may be requirements for filtering and/or conversion of phase information to digital form.

Frequently, phase-decoding systems require very narrow bandwidths relative to the modulated frequency, and such narrow bandwidths are often difficult and expensive to obtain.

A system which can achieve the requirements mentioned above and which can be relatively easily adapted for different applications would prove to be a useful device.

DISCUSSION OF THE PRIOR ART

Present methods for accomplishing phase and frequency filtering and phase to digital conversion include the use of passive and active filter circuits, analog phase-locked loops, and computers for processing and filtering of phase information.

Passive and active filters provide filtering of a signal but do not provide any analog to digital conversion of the phase information. Moreover, such filters must be specifically designed for each application and their ability to achieve narrow bandwidths is very limited. They are extremely susceptible to environmental conditions, especially where high performance is required. Moreover, the ability to provide variable bandwidth capability is difficult and frequently results in a detrimental trade-off of other filter parameters.

Analog phase-locked loops provide analog to digital conversion of the phase information and can be designed to have varying bandwidths. However, their ability to achieve narrow bandwidths is severely limited by the error sources which are inherent in analog circuitry. Moreover, analog phase-locked loops are susceptible to environmental conditions so that their performance deteriorates as environmental requirements increase.

In applications which require very narrow bandwidth operation, a phase-locked loop is frequently simulated by means of computer processing techniques. While such processing can result in very good performance, the cost and size requirements make such a solution impractical for many applications.

DESCRIPTION OF THE INVENTION

The invention comprises a digital phase-locked loop for processing an input signal to produce an output signal having a phase corresponding to the phase of the input signal. Moreover, the invention provides for a continuous conversion of phase information to parallel digital data form.

In accordance with a preferred embodiment thereof the phase of the input signal is compared with the phase of the output signal from a closed loop (described in more detail below) to produce a phase error signal which represents the phase difference between the phases of the input and output signals. The phase error signal is converted to a digital signal having a value which represents the error. In a preferred embodiment the digital signal is transferred to a programmable divider driven by a pulse clock signal from a suitable fixed frequency reference pulse generator. The programmable divider produces a pulse control signal, the frequency of which varies under control of the time-varying value of the digital signal representing the error. The pulse control signal from the programmable divider is then utilized to actuate a further means, such as a delete gate, which appropriately deletes one or more pulses from the pulsed output of the fixed reference oscillator which is fed thereto to produce an intermediate signal. The intermediate signal is fed to a counter which produces the output signal, the phase of which depends on the controlled number of pulses which has been deleted from the reference pulse clock signal. The output signal thereby has a phase which effectively follows the phase of the output signal, so that the difference therebetween (i.e., the error signal) tends to become reduced to zero.

The invention, thus, uses all digital operation and, for that reason, is less sensitive to environmental changes than devices using analog operation, the digital system further imposing less stringent requirements on system supply voltages, shielding characteristics, temperature control, and the like. Moreover, being all digital the invention requires negligible design time once the parameters of the system are determined. Thus, the bandwidth and center frequency of operation are determined solely by digital parameters and do not change with time, temperature, and the like.

Most importantly, extremely narrow bandwidth operation can be relatively easily achieved with a minimum of hardware so that the use thereof is especially practical where narrow bandwidth operation is desired. The only effective source of errors within the system can be primarily attributed to errors in the reference clock signal, which errors can be held to a minimum by the use of highly accurate crystal clock systems which are readily available to the art. The use of such clock systems in this invention results in high performance not attainable with previously available methods of phase filtering or, alternately, performance similar to extant systems but at much lower cost.

The invention can be described in more detail with the use of the accompanying drawings wherein FIG. 1 shows a block diagram of one embodiment of the invention;

Figure 1:
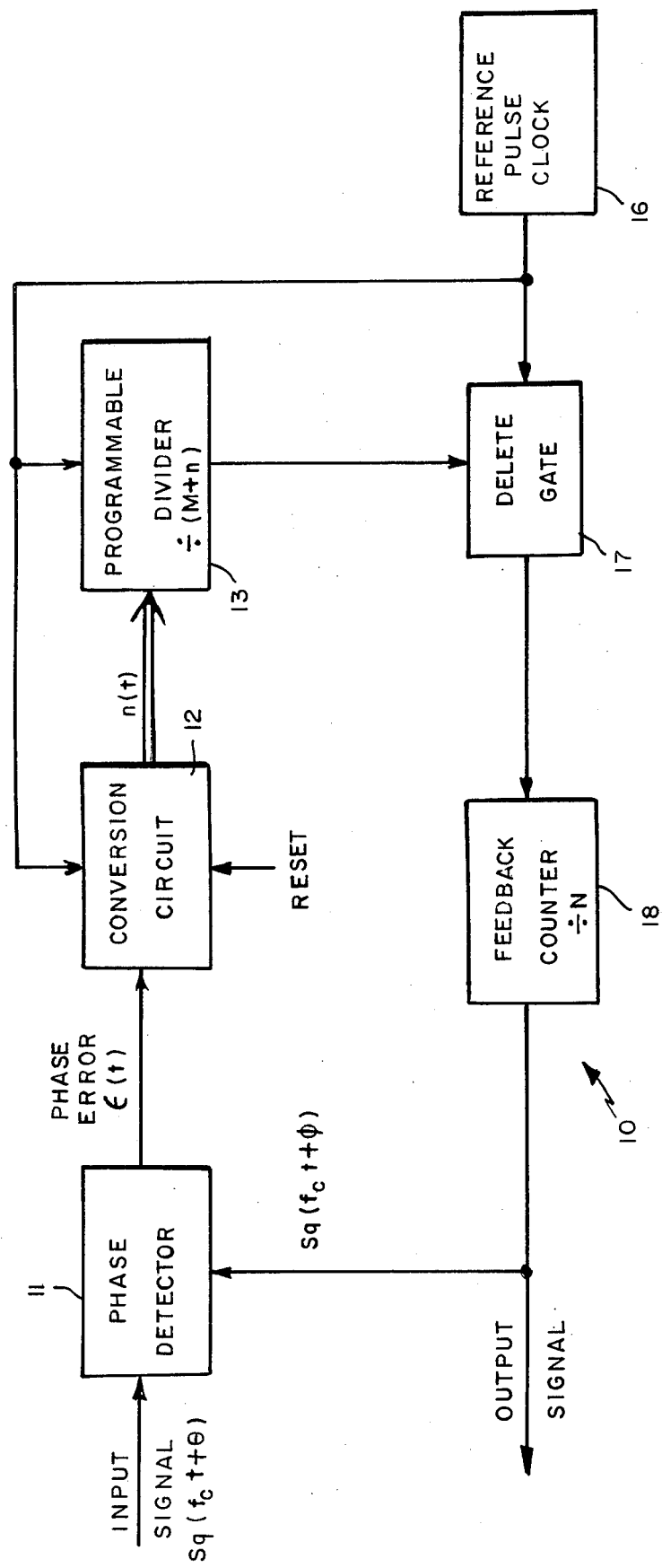

As can be seen in FIG. 1 the invention is a digital phase-locked loop 10 which uses a phase detector 11 having an input signal and an output signal fed thereto. The input signal to the loop is of the form $Sq(f_c t+\theta)$, where Sq denotes a square wave function, $f_c$ is the carrier frequency of the phase modulated signal, and $\theta$ is the phase thereof. The input signal is supplied to one input of the phase detector 11 which in a specific embodiment may be, for example, an exclusive OR circuit or, alternatively, conventional edge-triggered phase detector circuitry. The phase detector 11 compares the phase of the input signal with the phase of the output signal which is of the form $Sq(f_c t+\phi)$, the difference between the phases $(\theta - \phi)$ thereby representing a phase error signal as indicated at the output of the circuit by the designation "$\epsilon(t)$".

Figure 2:
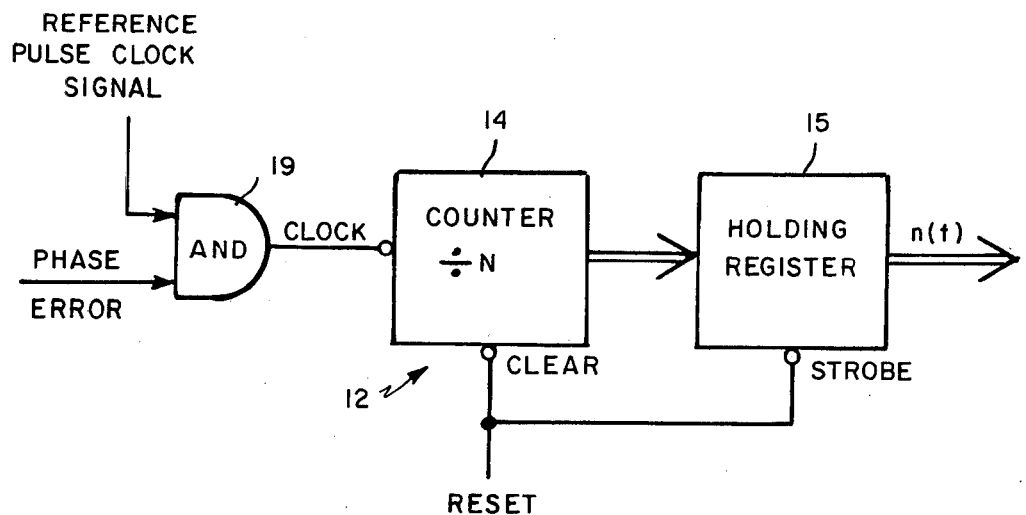
FIG. 2 shows a block diagram of a portion of the embodiment of FIG. 1.

The phase detector output is a pulse-width modulated signal which, when the phase error is zero, is a square wave having equal pulse widths at its two amplitude levels and which, when the phase error is not zero, is a wave having unequal pulse widths at its two amplitude levels. Thus, the error signal output of phase detector 11 is effectively a digital signal having phase error information in serial form. This serial phase error information signal is fed to a circuit 12 which converts such information to an appropriate parallel digital form for use in a programmable divider 13, as discussed in more detail below. This conversion can be easily implemented in circuit 12, as shown in FIG. 2, by using a counter 14 clocked at a rate higher than that of the carrier frequency, such counter being enabled and disabled by the phase detector error signal output via AND gate 19 as shown. The clocking signal is derived from a reference pulse clock signal generator 16, as shown, which can be implemented by using a crystal controlled pulse generator in a manner well known to the art. At suitably selected intervals, which may be any integral multiple of one cycle of $f_c$ depending on the application, the counter output is clocked into a holding register 15 and the counter is reset. For example, as in the embodiment shown in FIG. 1, the reset interval may be made equal to one carrier cycle.

In other applications, the reset interval may be several cycles of $f_c$ long, which will result in an average of the phase error during the reset interval being taken by the conversion circuit. In such a case either the entire number accumulated by the conversion circuit during the reset interval may be used as $n(t)$, or only some number of most significant bits of the number accumulated in the conversion circuit, depending on the application. The digital signal in the holding register 15 is a parallel digital signal (as depicted by the double-line arrow) and has a value represented by $n(t)$, which varies as a function of time between 0 and a maximum level, which in the embodiment under discussion is equal to N, and serves as a variable input to the programmable divider 13. In general, however, the maximum level may be made greater than or less than N.

The programmable divider is clocked by the reference pulse clock signal and divides the frequency thereof by $(M+n)$ where M has a fixed value and n has a time-varying value which depends on the phase error.

Figure 3:
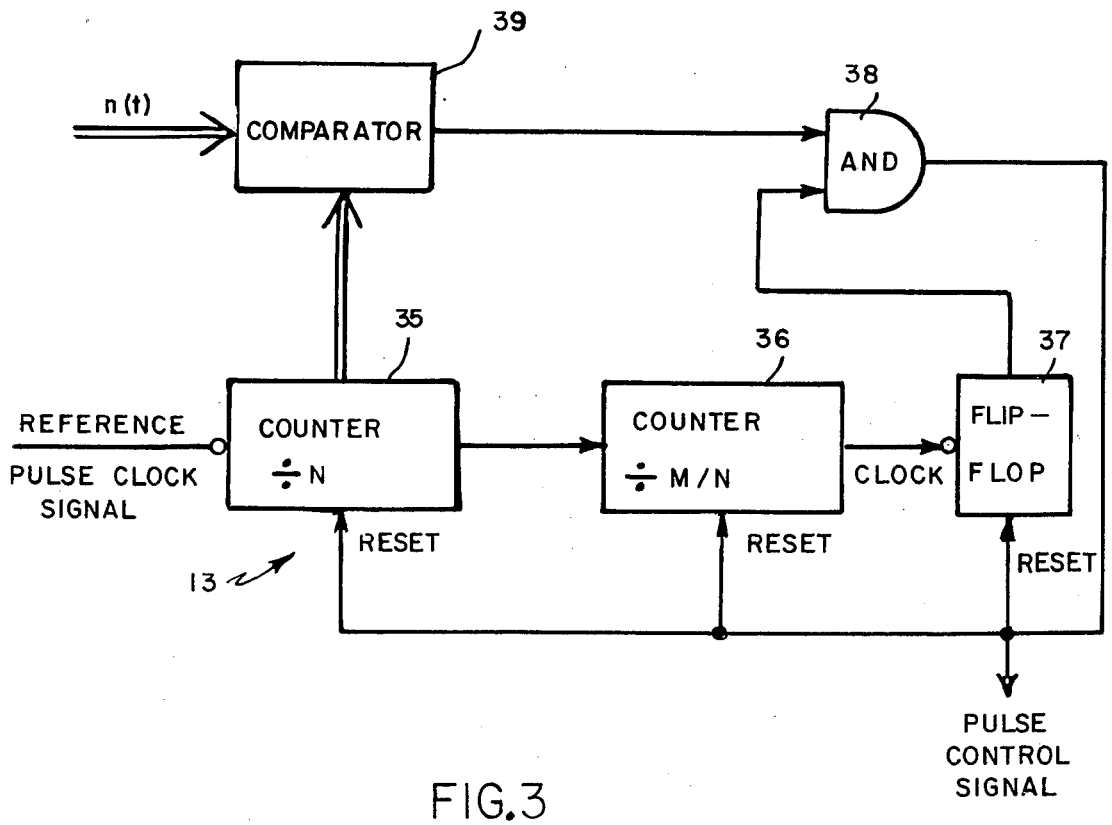
FIG. 3 shows a block diagram of another portion of the embodiment of FIG. 1.

The programmable divider can be realized, for example, by the circuit of FIG. 3. The reference clock signal clocks divide-by-N counter 35 whose output clocks divide-by-M/N counter 36 where M is a parameter having a fixed value on which the bandwidth depends, as discussed in more detail below. After M reference clock pulses, the output of counter 36 causes flip-flop 37 to change state from low to high, enabling AND gate 38 (in practice counter 35, counter 36, and flip-flop 37 can be combined and implemented as one counter). At this time, when AND gate 38 is first enabled, counter 35 is in its "0" state. The inputs to comparator 39 are the parallel digital outputs of counter 35 and the parallel digital value $n(t)$ from conversion circuit 12. When these inputs to comparator 39 are equal, the comparator output goes high and the output of AND gate 38 goes high. This resets counter 35, counter 36, and flip-flop 37 to zero, and the process is repeated. This reset signal also serves as a pulse control signal to delete gate 17. The operation of the programmable divider circuit results in one output pulse every $M+n(t)$ reference clock pulses.

The pulse control signal from programmable divider 13 is fed to a delete gate 17. The pulse control signal controls the number of reference clock pulses which are fed to a feedback counter 18. Normally, the reference clock pulse signal is fed unchanged through delete gate 17 to the feedback counter 18 which, in effect, divides the frequency of the signal by a suitable value "N" which results in a signal at the output of the feedback counter having a frequency which is equal to that of the input signal $f_c$. After each $(M+n)$ clock pulses, the delete gate is activated by the pulse control signal from the programmable divider 13 and the delete gate deletes a controlled number (e.g., usually one) of clock pulses in the reference clock signal which is being fed from the reference clock generator 16 through the delete gate to the feedback counter.

Figure 7:
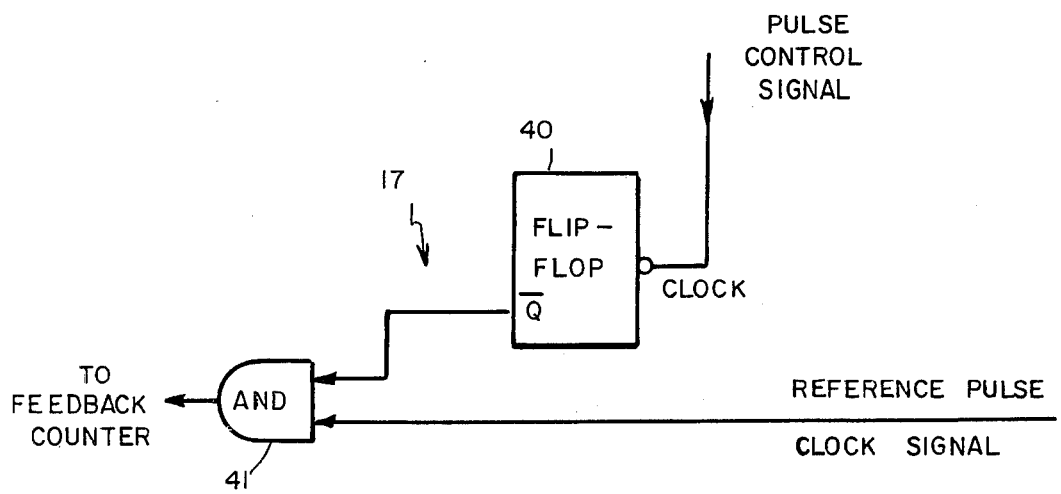
FIGS. 7 and 8 show block diagrams of specific means for controllably changing the number of pulses in the clock signals in the embodiments of the invention described above.

The delete gate 17 can be specifically implemented, for example, as shown in the block diagram of FIG. 7 where the rising or falling edge of the pulse control signal triggers a monostable flip-flop circuit 40. The complementary output $\overline{Q}$ (normally high) of flip-flop 40 disables AND gate 41 for a period $\tau$, during which period the reference pulse clock signal is inhibited from being supplied to feedback counter 18 through AND gate 41. The period $\tau$ of the monostable flip-flop 40 is chosen such that a desired number of pulses are deleted from the reference pulse clock signal. Other specific implementations will occur to those in the art to achieve the same functions.

The nominal output signal frequency is $$f_c = \text{(Reference Clock Frequency)} \left(1 - \frac{1}{M + \frac{N}{2}}\right)\left(\frac{1}{N}\right)$$

Therefore, the nominal reference clock frequency is $$\text{Reference Clock Frequency} = \frac{N \times f_c}{\left(1 - \frac{1}{M + \frac{N}{2}}\right)}$$

The reason for this deviation of the clock frequency from $N \times f_c$ is as follows. When the loop is in lock and tracking the input signal with zero phase error, the output of phase detector 11 is a square wave and the output of conversion circuit 12 is N/2. The operation of programmable divider 13 with an input of $n(t) = N/2$ causes delete gate 17 to delete a pulse every $$\frac{1}{M + \frac{N}{2}}$$

reference clock pulses. This results in the fraction $$\frac{1}{M + \frac{N}{2}}$$

of the clock pulses being deleted. Since it is desirable for the output of the digital phase locked loop to exactly equal the input signal in phase and frequency when the digital phase locked loop is in lock, the reference oscillator frequency must be offset by this amount in order for the output of delete gate 17 to equal $N \times f_c$ and, hence, the output frequency of feedback counter to equal $f_c$. Note that, since the reference oscillator frequency is offset only by the fraction $$\frac{1}{M + \frac{N}{2}}$$

and, under the assumption that M and N are much greater than unity, in explaining the operation of the conversion circuit 12 and the programmable divider 13, as shown in FIG. 1, the reference oscillator frequency can be considered to be $N \times f_c$ with negligible error. The pulse clock signal frequency as obtained at the output of the delete gate is divided by N in the feedback counter 18 so that the frequency of the output of the feedback counter is equal to the frequency $f_c$ of the input signal. When the phase error is not zero, the phase detector output is such that the phase conversion circuit 12 is enabled for a time period which is either greater or less than half a cycle, depending on the sign of the error signal $\epsilon$, i.e., the value "$n$" of the digital signal output of circuit 12 varies between 0 and N/2 or between N/2 and N. Programmable divider 13 will then divide the frequency of the reference pulse-clock signal by a number other than N/2 resulting in the deletion of a greater or lesser number of pulses in the clock signal being supplied to the feedback counter. Accordingly, the phase of the output signal from the feedback counter is either advanced or retarded until it equals the phase of the input signal.

The relationship between M and N is important to the operation of the loop. In a conventional analog phase-locked loop the frequency deviation of the voltage controlled oscillator is directly proportional to the phase error. In the digital phase-locked loop of the invention the frequency deviation in the signal fed to the feedback counter is inversely proportional to the phase error because of the division operation which occurs in the programmable divider 13. The open loop gain $G_{OL}$ of any phase-locked loop can be expressed as the ratio of the change in the output frequency $f$ out for a small change in the phase error $\epsilon$ at the phase detector:

$$G_{OL} = \frac{\Delta f_{out}}{\Delta \epsilon}$$

Generally, to achieve proper operation of a phase-locked loop this gain function must be linear, so that $G_{OL}$ is a constant.

Figure 4:
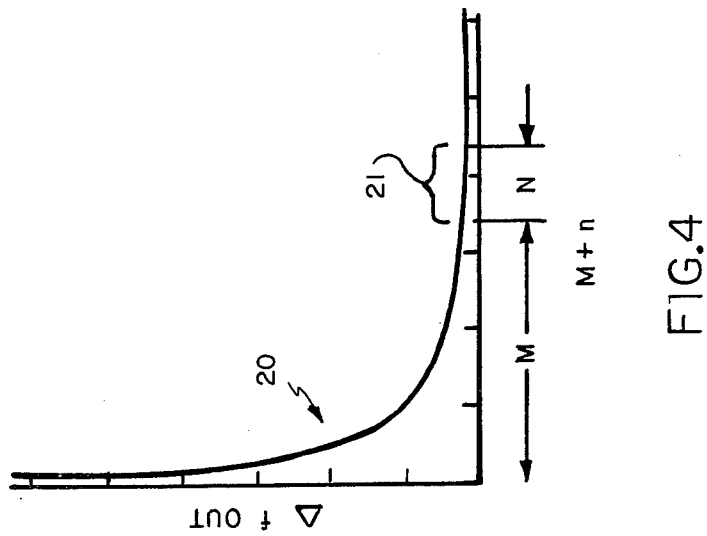
FIG. 4 shows a graph helpful in explaining the operation of FIG. 1.

In the invention described herein, if the programmable divider is allowed to operate over its full range, because the output frequency deviation $\Delta f_{out}$ is inversely proportional to the phase error, the open loop gain of the phase-locked loop would be a hyperbolic function instead of a linear function as shown by the curve 20 of FIG. 4. To achieve linear operation, the operation of the programmable divider 13 is arranged so that the open loop gain varies over a restricted region of the curve 20. Such operation is obtained by arranging for the divider to divide by $(M + n)$, where M has a fixed value and $n$ varies between O and N. If N is kept small with respect to M (i.e., M>>N) the tranfer function of the programmable divider is essentially linear, as shown in principle with reference to curve 20 of FIG. 4 where operation is shown over the region 21, where M is much greater than N. As M becomes larger, the bandwidth of operation becomes narrower. Such operation places no real restriction on the applicability of the digital phase-locked loop of the invention since this circuit is usually most useful in applications where the bandwidth of the phase-locked loop is small relative to the carrier frequency.

In accordance with the invention, the bandwidth, BW, can be expressed as follows:

$$BW = \frac{2 f_c}{[M + (N/2 - 2\phi_E)]^2} \quad \text{radians/sec}$$

The term $N/2 - 2\phi_E$ where $\phi_E$ is the phase error ($\theta - \phi$) in cycles, is dependent upon the instantaneous phase error of the loop, and thus the bandwidth of the loop is not strictly linear. But M will be much larger than N in actual practice and thus the approximation $$BW = \frac{2f_c}{M^2} \text{ radians/sec}$$

can be made with negligible error and negligible effect in loop performance. So long as the loop operation is approximately linear, as discussed above, the advantages of the invention can be realized. The bandwidth can be changed by changing the value of M which also requires a change in the value of the offset in the frequency of the reference pulse clock signal, in accordance with the previous discussion thereof.

While the embodiment discussed above with reference to FIG. 1 shows the use of clocking signals for the counter elements thereof which all have the same frequency (i.e., $\approx N \times f_c$), in a more general case, the clocking signal frequencies can all be different if desired. Thus, as shown by the block diagram of FIG. 5, the reference oscillator 16 may provide a reference pulse clock signal at any frequency $f_{ref}$ with the clock signals used in the system all being derived therefrom. The frequency of the clock signal for the conversion circuit 12 may be, for example, $L \times f_{ref}$, via frequency changing circuitry 30, while that of the programmable divider 13 may be, for example, $K \times f_{ref}$, via frequency changing circuitry 31, and that of the reference pulse clock signal supplied to the feedback counter 18 via gate 17 may be, for example, $X \times f_{ref}$, via frequency changing circuitry 32 as shown. If L=K=X, then the clocking signals are essentially the same as shown in FIG. 1.

Figure 6:
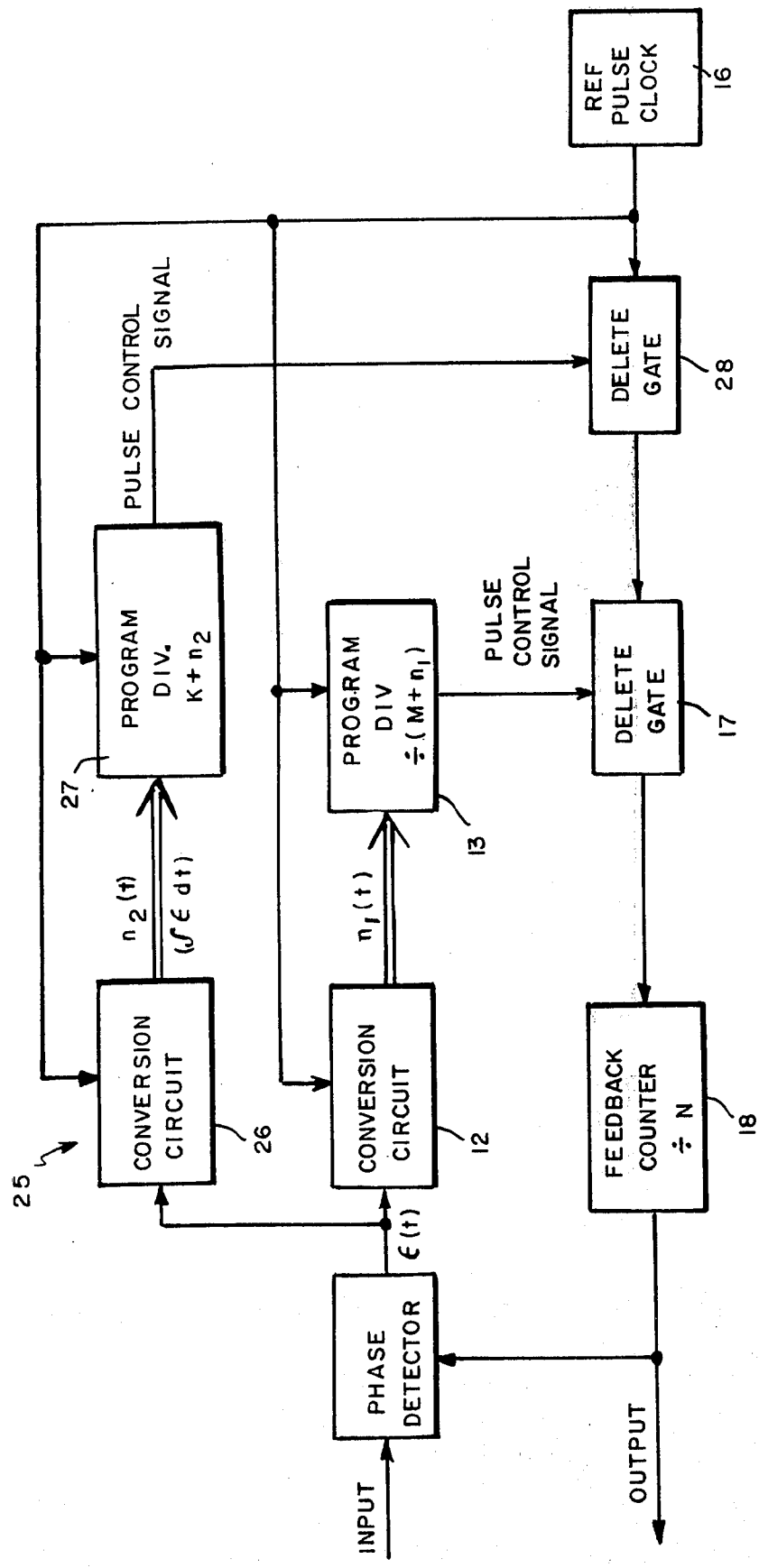
FIG. 6 shows an alternative embodiment of the invention providing higher order operation of the invention.

Second order operation can be achieved to further enhance the action of the phase-locked loop of the invention by utilizing an additional integrating loop which comprises an integrating path 25 for the error signal as shown in FIG. 6. Thus, the conversion circuitry 26 in path 25 may use, for example, a counter which is not reset and which, accordingly, performs an integrating operation on the phase error signal so as to provide a digital signal at the output thereof having a value $n_2(t)$ representing the integral of the error as symbolically shown in FIG. 6. Such signal is used in a manner similar to that discussed above with reference to the digital signal having a value $n_1(t)$ at the output of conversion circuit 12. Thus, the digital signal from circuit 26 is fed to a programmable divider 27 which is also responsive to the reference pulse clock signal from reference generator 16. The programmable divider 27 divides the frequency of the reference signal by $K + n_2$, where K will vary depending on the second order response desired, to produce a pulse control signal after each $(K + n_2)$ pulses. Such pulse control signal is likewise used to further control the deletion of the pulses from the reference pulse clock signal at a second delete gate 28 in series with delete gate 17, for example. When such a connection is used to form a higher order loop, the oscillator offset must be changed further similarly to that previously described for proper operation of the first-order digital phase locked loop.

While the descriptions of the above embodiments have discussed the phase tracking aspects of the invention, such embodiments can be utilized so as to provide for a continuous conversion of the phase information of the output signal as a parallel digital signal by strobing the feedback counter 18 to yield a digital representation of the phase angle $\phi$. A suitable way for performing such an operation is described in U.S. Pat. No. 3,706,902, issued on Dec. 12, 1972 to D. B. Cox, Jr. et al.

Figure 5:
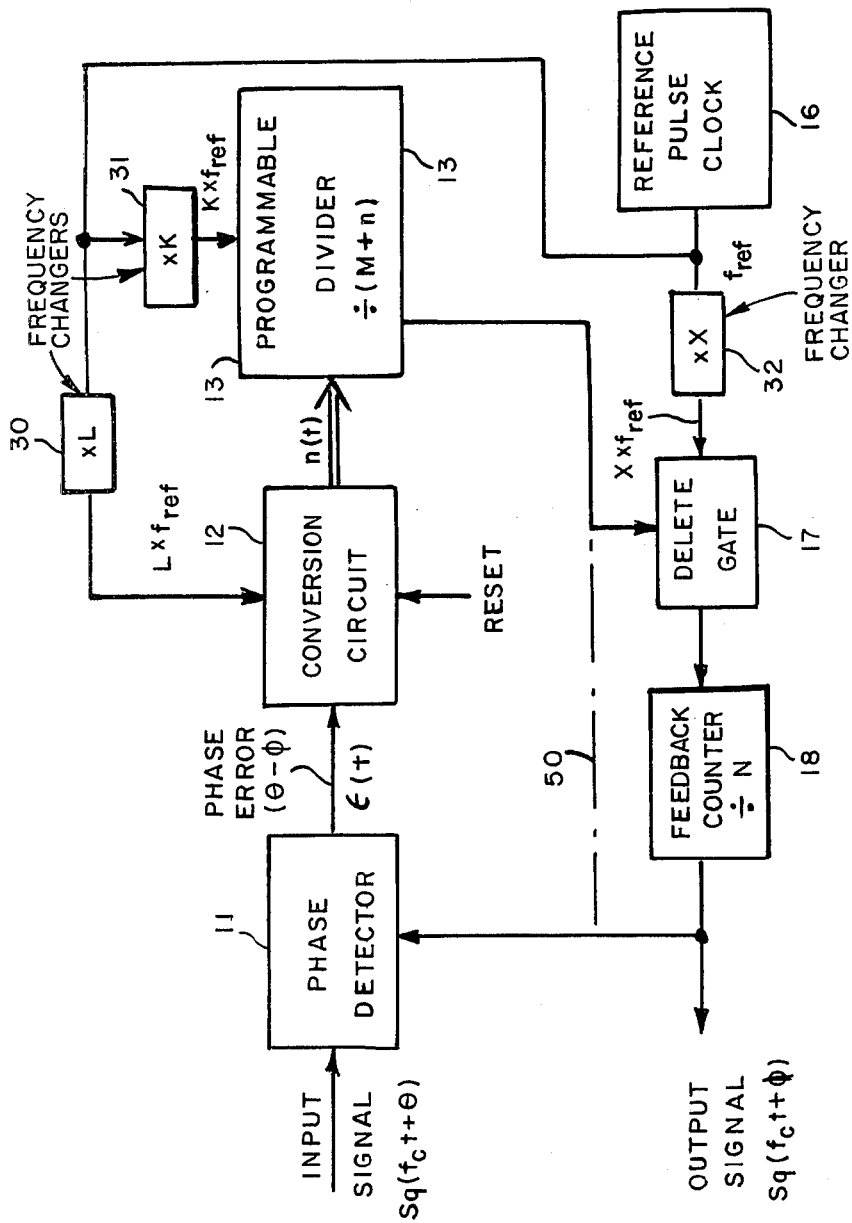
FIG. 5 shows an alternative embodiment of the invention depicted in FIG. 1.

Further, for some applications it may be desirable to utilize a simpler version of the embodiment of the invention shown in FIG. 5, wherein the output of the programmable divider is used to generate directly the square wave output signal ($sq(f_c t+\phi)$. In accordance therewith, the feedback counter 18, the delete gate 17 and the frequency changing circuitry 32 are omitted, while the output of programmable divider 13 represents the output signal and is fed directly to phase detector 11, as shown by dashed line 50. Such a structure is effectively equivalent to making X=0, and selecting N to equal 1. The values of M and $n(t)$ can be arbitrary positive numbers. While this relatively special embodiment of the more general embodiments of FIGS. 1 and 5 is simpler than those shown in the latter figures, it is more restricted in its resolution and bandwidth and cannot be used to provide for a direct digital conversion of the output signal phase information through the strobing operation discussed above in connection with the feedback counter 18.

While the above embodiment of the invention seem most preferred at this time, modifications thereof may occur to those in the art within the spirit and scope of the invention.

Figure 9:
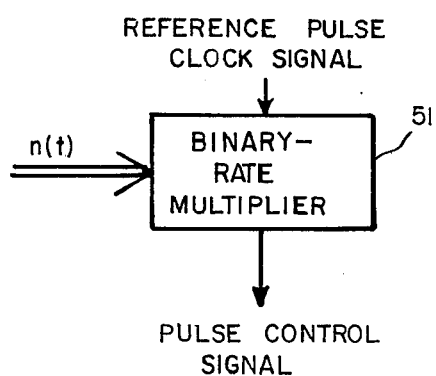
FIG. 9 shows an alternative embodiment of part of FIG. 1.

For example, other digital means can be substituted for the programmable divider 13 for generating a frequency that varies in an exact, or approximately, linear fashion in response to the signal $n(t)$. Thus, a binary-rate multiplier 51, the structure and operation of which is known to those in the art, can be used, as shown in FIG. 9.

Further, while a delete gate is shown as used to delete one or more pulses from the reference clock signal which is fed to the feedback counter, it is also possible to arrange the frequency of the reference signal being fed thereto to be such that the phase of the output signal is advanced or retarded in accordance with the addition, rather than the deletion, of one or more pulses to the reference signal. Thus, the latter signal is fed to the feedback counter via an appropriate pulse adding means instead of a pulse deletion means.

Similarly, the reference pulse clock signal in FIG. 1 can be divided by $$\left(M + \frac{N}{2}\right)$$

to produce an offset-compensation signal with a pulse rate equal to the nominal pulse rate from the programmable divider 13, and the pulses of the offset-compensation signal can be appropriately added to the reference signal at the input of the delete gate 17. Then the nominal clock offset is compensated and the nominal reference pulse clock signal can be at a frequency of exactly $N \times f_c$.

Figure 8:
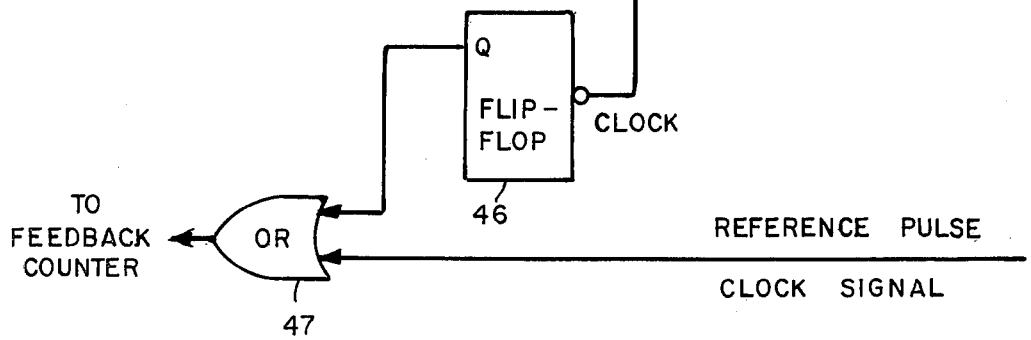

Such pulse adding means can be implemented, for example, as shown in FIG. 8 where the rising or falling edge of the pulse control signal triggers a monostable flip-flop circuit 45. The period of flip-flop circuit 45 is approximately one-half the period between the reference pulse clock pulses (i.e., $$\frac{1}{N \times f_c}$$

seconds), and the trailing edge of the pulse from monstable flip-flop 40 triggers a second monostable flip-flop circuit 46, the period of which is chosen as very short compared to the period between clock pulses. The output pulse from flip-flop 46 is added to the reference clock pulse signal by OR gate 47, as shown.

Further, the circuit shown herein may be useful in some applications where linear operation is not necessarily required (e.g., in some noise-free applications), in which case the value of M need not be greater than N. In such non-linear applications, for example, M might be set equal to or less than N or, if desired, M can even be set at 0.

In addition, with respect to the second order operation discussed in connection with the specific implementation shown in FIG. 5, those in the art may devise other ways of achieving said second order operation. Moreover, higher order loops may be devised to achieve higher order responses, the implementations of which would be apparent to those in the art in accordance with teachings of the invention.

Accordingly, the invention is not to be construed as limited to the specific embodiments and shown herein except as defined by the appended claims.

What is claimed is:

1. A phase processing system comprising means responsive to an input signal having a first phase and further responsive to an output signal having a second phase for producing an error signal representing the phase difference between said first and second phases;
   means for producing a reference clock signal having a fixed clock frequency;
   means responsive to said clock signal and to said error signal for converting said error signal to a digital signal having a value representing said error signal;
   means responsive to said clock signal and to said digital signal for producing a pulse control signal having a frequency which varies in accordance with the time-varying value of said digital signal;
   means responsive to said pulse control signal and to said reference pulse clock signal for controllably changing the number of pulses from said reference pulse clock signal in response to said pulse control signal to produce an intermediate clock signal;
   means responsive to said intermediate clock signal for producing said output signal, the phase of which depends on said controlled number of pulses.

2. A system in accordance with claim 1 wherein said pulse changing means comprises means for deleting a controlled number of pulses from said reference clock signal; and
   the phase of said output signal depends on said controlled number of deleted pulses.

3. A system in accordance with claim 1 wherein said pulse control signal producing means comprises
   means for producing a pulse control signal having a frequency equal to the frequency of said clock signal divided by a value representing the sum of a predetermined value and the time-varying value of said digital signal.

4. A system in accordance with claim 3 wherein said predetermined value is M; and
   said time-varying value is $n(t)$ wherein $n(t)$ varies between O and N.

5. A system in accordance with claim 4 wherein the values of M and N are selected so that M is greater than N.

6. A system in accordance with claim 4 wherein the values of M and N are selected so that M is less than or equal to N.

7. A system in accordance with claim 4 wherein the value of M is equal to O.

8. A system in accordance with claim 1 wherein said error signal converting means comprises
   means responsive to said clock signal and to said error signal for producing a clock enabling signal;
   re-settable counter means responsive to said clock enabling signal for clocking said counter to produce a counter output during each reset interval;
   holding register means responsive to said counter output for producing said digital signal.

9. A system in accordance with claim 8 wherein said reset interval is an integral multiple of one cycle of the clock signal.

10. A system in accordance with claim 9 wherein said reset interval is one cycle of the clock signal.

11. A system in accordance with claim 1 wherein said pulse control signal producing means comprises
    first counter means responsive to said clock signal for producing a first counter output signal;
    second counter means responsive to said first counter output signal for producing a second counter output signal after a selectable and fixed number of pulses;
    flip-flop circuitry for producing a signal which changes state in response to said second counter output signal;
    means for comparing the parallel digital outputs of said first counter and said digital signal to produce a pulse signal when said compared signals are equal;
    means responsive to said pulse signal and to said change of state signal for producing said pulse control signal.

12. A system in accordance with claim 11 wherein the frequency of said pulse control signal is equal to the frequency of said clock signal divided by a value representing the sum of a fixed value M and the time-varying value $n(t)$ of said digital signal which time-varying value varies between O and N and further wherein
    said first counter means divides the frequency of said clock signal by N; and
    said second counter means divides the frequency of the first counter output signal by M/N.

13. A phase processing system comprising
    means responsive to an input signal having a first phase and further responsive to an output signal having a second phase for producing an error signal representing the phase difference between said first and second phase;
    means for producing a pulse clock signal having a fixed clock frequency;
    means responsive to said pulse clock signal for producing a first reference signal having a first frequency proportional to that of said pulse clock signal;
    means responsive to said first reference signal and to said error signal for converting said error signal to a digital signal having a digital value representing the value of said error signal;
    means responsive to said pulse clock signal for producing a second reference signal having a second frequency proportional to that of said pulse clock signal;
    means responsive to said second reference signal and to said digital signal for producing a pulse control signal having a frequency equal to the frequency of said second reference signal divided by a value representing the sum of a fixed value and said digital value;
    means responsive to said pulse clock signal for producing a third reference signal having a third frequency proportional to that of said pulse clock signal;

means responsive to said third reference signal and to said pulse control signal for controllably changing the number of pulses from said third reference signal in response to said pulse control signal to produce an intermediate clock signal;

means responsive to said intermediate clock signal for producing said output signal the phase of which depends on said controlled number of pulses.

14. A system in accordance with claim 13 wherein said pulse changing means comprises means for deleting a controlled number of pulses from said third reference signal; and the phase of said output signal depends on said controlled number of deleted pulses.

15. A phase processing system in accordance with claim 1 and further including at least one higher order path comprising means for producing a further phase control signal in response to one or more integrations of said phase error signal.

16. A phase processing system in accordance with claim 15 wherein said system includes a single second order path comprising means for producing said further phase control signal in response to a single integration of said phase error signal.

17. A phase processing system in accordance with claim 16 wherein said second order path includes means responsive to said clock signal and to said error signal for producing a second digital signal having a value representing the integral of said error signal;

means responsive to said clock signal and to said second digital signal for producing said further pulse control signal having a frequency which varies in accordance with the time-varying value of said second digital signal;

further means responsive to said reference pulse clock signal for further changing the number of pulses from said reference pulse clock signal in response to said second pulse control signal to produce said intermediate signal.

18. A system in accordance with claim 7 wherein said further pulse changing means comprises means for further deleting a controlled number of pulses from said reference pulse clock signal; and the phase of said output signal further depends on said controlled number of deleted pulses.

19. A system in accordance with claim 1 wherein said pulse changing means comprises means for adding a controlled number of pulses to said reference pulse clock signal; and the phase of said output signal depends on said controlled number of added pulses.

20. A system in accordance with claim 2, wherein said output signal producing means comprises a continuously recycling counter.

21. A system in accordance with claim 1, wherein said pulse changing means comprises means for altering the number of pulses from said reference pulse clock signal by a predetermined amount in response to each pulse of said pulse control signal.

22. A system in accordance with claim 21, wherein the phase of said output signal if modified in direct proportion to the predetermined amount by which the number of pulses of said reference pulse clock signal is altered.

23. A system in accordance with claim 21 wherein said means for producing said output signal producing means comprises a counter that recycles upon reaching the count N, where N is a predetermined number.

24. A phase-processing system comprising means responsive to an input signal having a first phase and further responsive to an output signal having a second phase for producing an error signal representing the phase difference between said first and second phases;

means for producing a pulse clock signal having a fixed clock frequency;

means responsive to said pulse clock signal for producing a first reference signal having a first frequency proportional to that of said pulse clock signal;

means responsive to said first reference signal and to said error signal for converting said error signal to a digital signal having a digital value representing the value of said error signal;

means responsive to said pulse clock signal for producing a second reference signal having a second frequency proportional to that of said pulse clock signal; and means responsive to said second reference signal and to said digital signal for producing said output signal having a frequency that varies in accordance with the time-varying value of said digital signal.

25. A system in accordance with claim 1 wherein said pulse control signal producing means comprises means for producing a pulse control signal having a frequency directly proportional to the frequency of said clock signal multiplied by the time-varying value of said digital signal.

* * * * *